United States Patent [19]

Ryon

[11] 4,412,187

[45] Oct. 25, 1983

[54] PHASE ADJUSTABLE HORIZONTAL OSCILLATOR FOR A DATA DISPLAY MONITOR

[75] Inventor: Donald C. Ryon, Carol Stream, Ill.

[73] Assignee: Motorola, Inc., Schaumburg, Ill.

[21] Appl. No.: 260,518

[22] Filed: May 4, 1981

[51] Int. Cl.³ .................... H03D 1/00; H03K 9/00
[52] U.S. Cl. .......................... 331/108 D; 331/145; 331/153
[58] Field of Search ............... 331/108 D, 145, 153, 331/172, 173; 358/148, 158; 315/409, 410

[56] References Cited

U.S. PATENT DOCUMENTS 4,253,117 2/1981 Kadlec .............................. 331/145

OTHER PUBLICATIONS

"Get Control Over Oscillator Duty Cycle by Adding One Diode to Circuit", by Thomas M. Farr, Jr.—Electronics Design 20, Sep. 27, 1978-p. 96.
"Rearranged Components Cut 555's Initial-Pulse Errors" by Kamalakar D. Dighe—EDN Jan. 5, 1978, vol. 23, No. 1, pp. 82-84.

Primary Examiner—Stanley D. Miller
Assistant Examiner—S. V. Clark
Attorney, Agent, or Firm—Margaret Marsh Parker; James W. Gillman; James S. Pristelski

[57] ABSTRACT

A horizontal oscillator for a CRT device runs at a rate higher than the line rate, and has a wide lock-in range. The horizontal sync signal is delayed in an adjustable monostable circuit and coupled to the oscillator for allowing a centering adjustment of one full line. The oscillator output signal is coupled through a discharge circuit for rapid discharge of the subsequent circuit in the CRT device as desired.

2 Claims, 2 Drawing Figures

I.C. TERMINALS
1. GROUND
2. TRIGGER
3. OUTPUT
4. RESET
5. CONT. VOLT.
6. THRESHOLD
7. DISCHARGE
8. V+

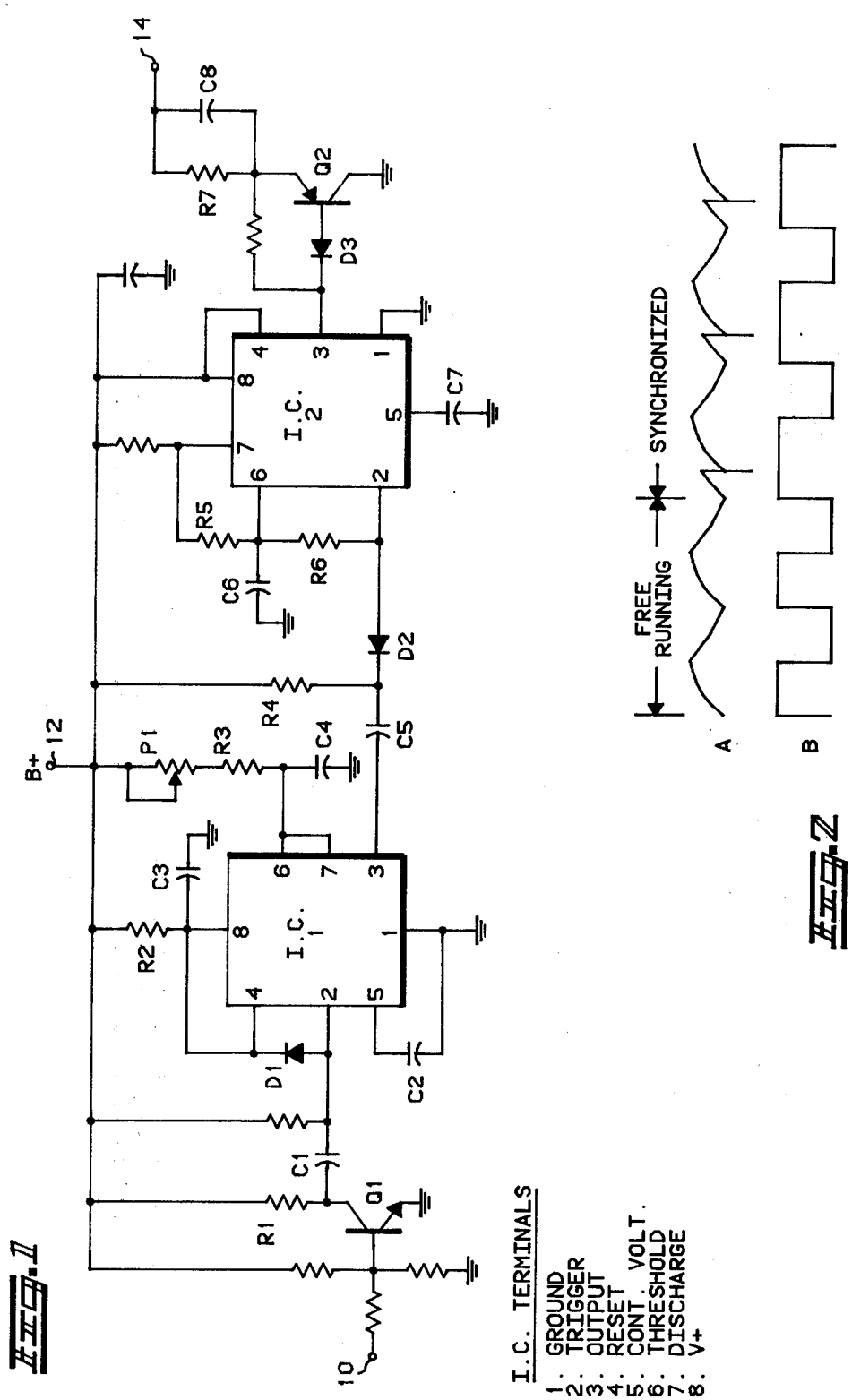

PHASE ADJUSTABLE HORIZONTAL OSCILLATOR FOR A DATA DISPLAY MONITOR

BACKGROUND OF THE INVENTION

The present invention relates to the field of horizontal oscillators for CRT devices and, more particularly, to an oscillator circuit which will prevent overload damage during loss of sync signals, and will allow a wide range of centering control.

In most raster scanning CRT devices, such as data display monitors, the oscillator which drives the horizontal output signal is designed to free-run at a rate slightly lower than the synchronized rate. Such monitors pose a particular problem since a loss of sync signal will cause the horizontal oscillator to revert to its much lower free running frequency and the resulting deflection current and high voltage may be high enough to overheat and cause permanent damage to the components in the horizontal output system. In the usual TV circuit, only one sync rate is used, and the oscillator is only required to pull-in for approximately 800 Hz. In monitors requiring a wider pull-in to accommodate various sync rates, a change of component values has been necessary.

A duty cycle of greater than 50% is needed in order to achieve proper scan for the monitor. It is also desirable to be able to adjust the delay of the horizontal output signals for centering the display within the raster and to accommodate other delays in the system. This combination of signal characteristics has been difficult to achieve with prior circuitry, and particularly at low cost.

It is an object, therefore, of the present invention to provide a horizontal oscillator which is operable over a range of frequencies and which will free-run at a frequency higher than the desired range of frequencies.

It is another object to provide such an oscillator with an adjustable delay in its sync signal supply.

It is still another object to provide such an oscillator with a duty cycle greater than 50%.

It is yet another object to provide such an oscillator at low cost.

These objects and others which will become apparent are achieved in an oscillator circuit having an adjustable delay circuit which can provide, approximately, a one-line range of delays in the horizontal sync pulse signal. The video signals can thus be centered in the raster regardless of the sync signal frequency, as well as compensating for any other delays in the horizontal circuitry of the CRT device. The oscillator is operable over the possible range of sync frequencies and will free-run at a frequency above that range.

BRIEF DESCRIPTION OF THE DRAWING

FIG. 1 is a schematic diagram of a preferred embodiment of the invention.

FIG. 2 is a waveform chart for the oscillator portion of the invention.

DETAILED DESCRIPTION OF THE PREFERRED EMBODIMENT

In FIG. 1, the signals received at an input terminal 10 will be the normal horizontal sync signals as derived from a video signal which in this embodiment is a data display signal. The signals will have a possible frequency range of several kilohertz; e.g., from 16.5 KHz to 25 KHz, although at present the highest sync frequency used to approximately 21 KHz.

The B+ voltage at a supply terminal 12 will be approximately 12 V in this embodiment. A first transistor Q1 amplifies and inverts the input signal from the terminal 10, R1 and C1 differentiate the amplified signal, and D1 clips off the positive going spikes. The signal at the trigger input of an IC 1 is thus at an 11–12 V level, with negative going spikes to essentially 0 V at the horizontal sync frequency.

The IC 1 is a timer or delay circuit, and may be the Motorola MC1455 or 1555, with terminals as shown in the figure detail. The control voltage terminal is coupled to ground via C2. The horizontal sync signals are filtered off the B+ by means of R2 and C3. The length of the signal delay is set by C4, R3 and a portion of the potentiometer P1. The output signal from IC 1 is a square wave going from 0 V to 12 V with a small spike on the positive going transition, and a greater than 50% duty cycle. The variable delay is a function of the timing of the negative-going transition with respect to the positive-going transition. Moving the negative-going transition thus can vary the sync delay from one-half line to one and one-half lines.

The combination of R4 and C5 form another differentiator with D2 clipping off the positive going spike. The negative going spike is the trigger for an IC 2 which may also be a "555" timer like IC 1. IC 2 is connected for operation as a controlled oscillator which, with no sync signal input, will free-run at a frequency higher than when it is controlled by an input signal; e.g., at 22.2 KHz.

As shown in FIG. 2 (waveform 2A) the signal at the terminal 2 of IC 2 will be a form of saw tooth wave (from the feedback network of R6) with the sync pulse riding on the rising portion and movable on that portion. That is, with no sync input, the IC 2 output will be the usual saw tooth, whereas, with a sync input, the saw tooth wave will be interrupted or reset at the sync pulse.

If the sync frequency were higher than the free-running frequency, the sync pulse would fall on the falling portion of the sawtooth, shortening the period accordingly.

The frequency determining components for the oscillator are then R5 and C6. R6 is a small value resistor which prevents the sync (pin 2) from being across C6 as well as providing the necessary feedback for the oscillator. Typical values here would be R5=28K, C6=1000 pf, and R6=560 Ω. The sync pulse from D2 tends to cancel the charge on C6, through R6, then let it start to recharge.

The output of the IC2, at pin 3 is approximately as shown in FIG. 2 (waveform 2B) with an on-time duty cycle greater than 50%. Since the requirements of the horizontal output stage (not shown) input signal, at a terminal 14, are for such a duty cycle, that requirement is met for all synced signals.

A transistor Q2 is coupled to the output of the IC 2 via a diode D3, and is bypassed during the positive-going part of the cycle. This transistor is needed in order to quickly draw the stored charge current out of the base of the horizontal output stage which is coupled to the terminal 14. When the emitter to collector of Q2 is effectively shorted, a near dead short is provided to the following stage which may be providing a current of as much as 400 ma peak. The combination of R7 and C8 help form a sharp rise time for the pulse, then the charge stored on C8 helps to discharge the carriers from the base of Q2.

The system is thus a direct drive system, with no AFC, and with no oscillator coils, transformers or other expensive components. The one control, P1, provides for data centering at all sync frequencies, allowing for delays in the circuit such as those due to the various storage transistion times in the yoke coil and output stage.

Thus there has been shown and described a horizontal oscillator circuit as for a CRT data display monitor wherein, with two inexpensive IC's and a minimum of other components, none expensive, the oscillator will free-run at a frequency higher than the desired sync frequencies. Thus the components of the horizontal output circuitry are protected from possible damage due to loss of sync signals, and the video data can be centered under all conditions. Other variations and modifications are possible and it is intended to cover all such as fall within the spirit and scope of the appended claim.

What is claimed is:

1. Horizontal oscillator circuitry as for a CRT data display monitor and comprising:

input means for providing a horizontal synchronizing signal having a range of possible frequencies and including an inverting circuit, a differentiating circuit coupled to the output of the inverting circuit, and means for clipping the differentiated signal to provide a negative going spike in response to each pulse of the received signal;

an adjustable delay circuit coupled to the input means for delaying the received signal over a range of at least one horizontal line period and including a controllable delay means, means for adjusting the delay means, a differentiator coupled to the output of the delay means, and means for clipping the differentiated signal to provide a delayed negative spike in response to each pulse of the received signal;

an oscillator coupled to the delay circuit for being synchronized by the delayed signals and adapted to oscillate at a first predetermined frequency when no signal is being received, said predetermined frequency being higher than the range of possible synchronizing frequencies;

a discharge circuit coupled to the output of the oscillator for providing immediate discharge for a portion of the horizontal output circuitry of the CRT monitor and including means for disenabling the discharge during the positive portions of the oscillator output signals; and output means for coupling the output signals of the discharge circuit to said portion of the horizontal output circuitry.

2. Horizontal oscillator circuitry in accordance with claim 1 wherein the output signals at the output means are substantially square wave signals having a duty cycle greater than 50%.

* * * * *